(12) United States Patent
Kozlowski et al.

(10) Patent No.: US 6,476,374 B1
(45) Date of Patent: Nov. 5, 2002

(54) ROOM TEMPERATURE, LOW-LIGHT-LEVEL VISIBLE IMAGER

(75) Inventors: Lester J. Kozlowski, Simi Valley, CA (US); Gerard J. Sullivan, Newbury Park, CA (US); Roger E. Dewames, Thousand Oaks, CA (US); Brian T. McDermott, Glendale, AZ (US)

(73) Assignee: Innovative Technology Licensing, LLC, Thousand Oaks, CA (US)

( * ) Notice: Subject to any disclaimer, the term of this patent is extended or adjusted under 35 U.S.C. 154(b) by 0 days.

(21) Appl. No.: 09/557,133

(22) Filed: Apr. 25, 2000

(51) Int. Cl.[7] .......................................... H01L 31/0304
(52) U.S. Cl. ................................. 250/214.1; 257/444
(58) Field of Search ....................... 250/214.1; 257/615, 257/82, 114, 444, 446, 448, 459, 461

(56) References Cited

U.S. PATENT DOCUMENTS

| | | | |
|---|---|---|---|
| 4,214,264 A | 7/1980 | Hayward et al. | 358/44 |
| 4,499,497 A | 2/1985 | Levine | 358/213 |
| 4,581,625 A | 4/1986 | Gay et al. | 357/30 |
| 4,651,001 A | 3/1987 | Harada et al. | 250/330 |
| 5,146,296 A | 9/1992 | Huth | 357/19 |
| 5,627,112 A | 5/1997 | Tennant et al. | 438/113 |
| 5,763,896 A | 6/1998 | Smith | 257/14 |
| 5,818,052 A | * 10/1998 | Elabd | 250/370.06 |
| 5,929,434 A | * 7/1999 | Kozlowski et al. | 250/214 A |
| 5,981,988 A | 11/1999 | Conder et al. | 257/249 |
| 6,127,692 A | * 10/2000 | Sugawa et al. | 257/30 |
| 6,130,441 A | * 10/2000 | Bowers et al. | 257/15 |

OTHER PUBLICATIONS

L.J. Kozlowski et al. "*SWIR Straing FPA Performance at Room Temperature*", 1996. SPIE The International Society for Optical Engineering, *Infrared Readout Electronics III*, 1996.

Saks, *A Technique for Suppressing Dark Current Generated by Interface States in Buried Channel CCD Imagers*, IEEE Electron Device Letters, vol. EDL–1, No. 7, Jul. 1980, pp. 131–133.

* cited by examiner

*Primary Examiner*—Robert H. Kim
*Assistant Examiner*—Hoon K. Song
(74) *Attorney, Agent, or Firm*—Koppel, Jacobs, Patrick & Heybl

(57) ABSTRACT

A photodetector sensitive to visible and shorter wavelengths is capable of single photon sensitivity at room temperatures and video frame rates. It includes (a) a compound semiconductor photodiode, biased below its avalanche breakdown threshold, comprising III–V elemental components and having a bandgap with transition energy higher than the energy of infrared photons; and (b) a high trans-impedance interface circuit, arranged to receive a signal from the photodiode junction and to amplify said signal. Preferably, the photodiode junction is integrated in a first microstructure on a first substrate, and its interface circuit in a second microstructure on a second substrate. Both microstructures are then joined in a laminar, sandwich-like structure and communicate via electrically conducting contacts.

28 Claims, 8 Drawing Sheets

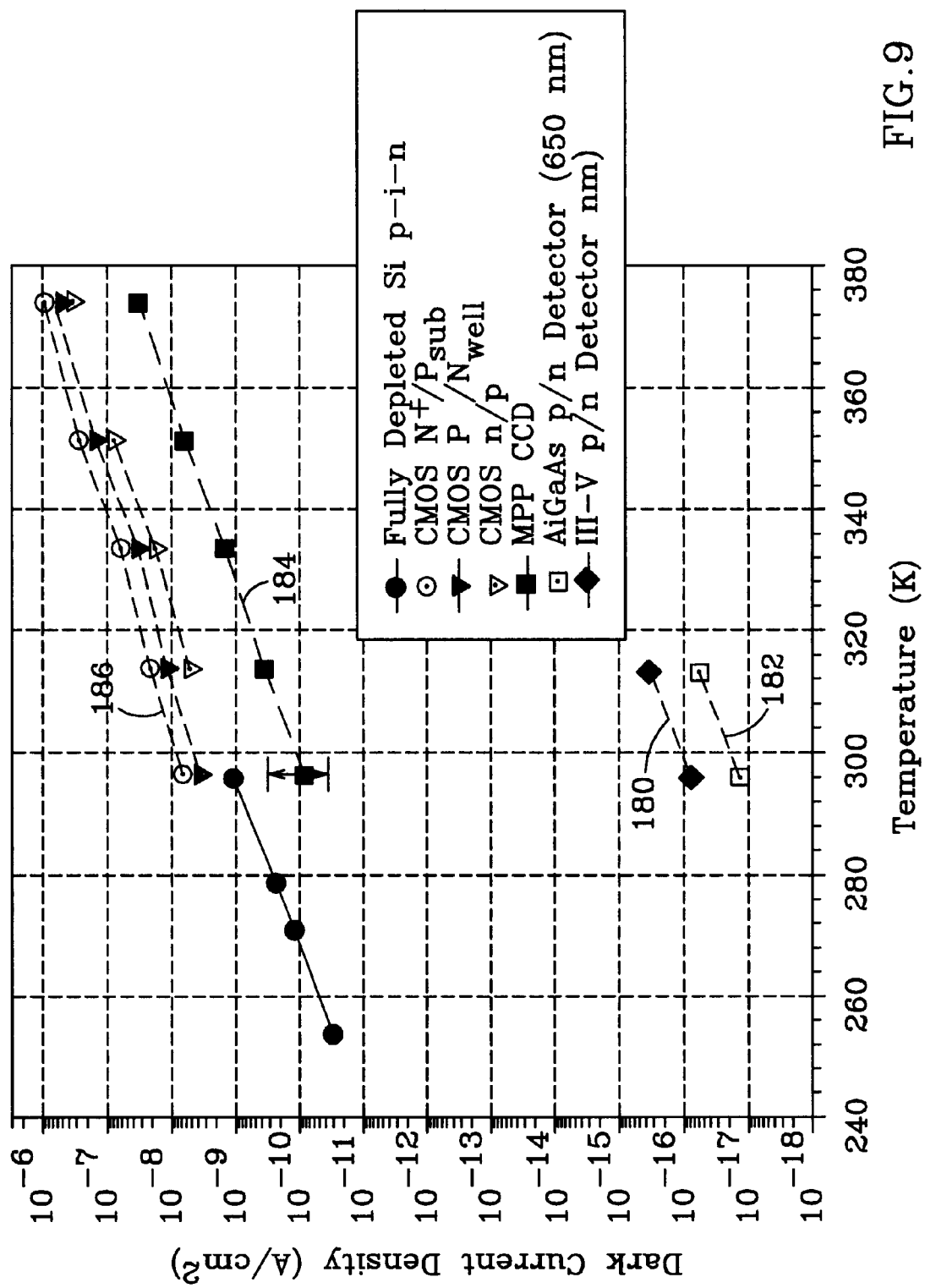

ROOM TEMPERATURE, LOW-LIGHT-LEVEL VISIBLE IMAGER

BACKGROUND OF THE INVENTION

1. Field of the Invention

This invention relates to solid state, low-level light detectors in general and specifically to room temperature, low-level visible and shorter wavelength imagers using III–V compound semiconductor photodetectors.

2. Description of the Related Art

Visible-light sensors transform incident light in the visible region of the spectrum (wavelengths from approximately 0.38 to 0.78 microns) into electrical signals that are used for data collection, processing, and storage. For example, the such sensors can capture images for video or still-frame imaging. Conventional solid-state sensors usually employ silicon photodetectors because they are inexpensive, exhibit adequate signal bandwidth, are sensitive to visible wavelengths, and exhibit a high degree of pixel-to-pixel uniformity when used in an imaging array.

Silicon photodetectors exhibit significant deficiencies when applied at room temperature for visible wavelength detection, however. At or near room temperature, these detectors have a characteristic "dark current" which is relatively high and causes prominent noise characteristics. The dark current is a fundamental consequence of the detector physics: common silicon photodetectors exhibit an energy bandgap in the 1.1 eV range, which is well below the threshold for visible wavelength absorption. This low bandgap gives rise to a large dark current (at normal room temperatures). Silicon photodetectors which are compatible with. low to moderate cost production also have no gain: i.e. each incident photon generates at most a single electron. The combination of low gain and large dark currents limits the practical application of Silicon photodiode detectors to moderate to bright light conditions, unless active cooling is used. At low light levels and at room temperature such detectors generate inadequate signal-to-noise ratios (SNR).

In low-light-level applications, the standard silicon photodiode detector is often replaced with a silicon avalanche detector to facilitate gain within the detector so that conventional detector interface amplifiers and ancillary interface circuits can be used to read out the data at video frame rates with a high SNR. Such applications of avalanche photodiodes are disclosed by U.S. Pat. No. 5,146,296 to Huth and U.S. Pat. No. 5,818,052 to Elabd, for example. Unfortunately, the fabrication of avalanche photodiodes is much more difficult and expensive than standard photodiodes, and supplemental amplification is also often required. Currently available avalanche photodiodes exhibit relatively poor uniformity and have limited sensitivity due to their low quantum efficiency. They are also inherently non-linear in their response to light, which is undesirable in many applications.

Alternative imaging systems are known which use an array of avalanche detectors, various phosphors or intensifiers such as microchannel plates to amplify the available electrons for subsequent detection in enhanced charge coupled devices (CCDs); but these intensified devices respond inadequately to broadband radiation otherwise available to maximize sensitivity. All such CCDs and other metal-insulator-semiconductor (MIS) devices have surface states at the semiconductor/insulator interface that cause spontaneous generation of dark current. Furthermore, intensified CCDs are damaged by the soft x-rays associated with electron bombardment. This damage is manifest as even higher dark current. This current provides an undesirable background signal that reduces dynamic range, both by consuming charge handling capacity and by adding noise. CCD Manufacturers employ various schemes to suppress dark current, such as that described by Saks, "A Technique for suppressing Dark Current Generated by Interface States in Buried Channel CCD Imagers," IEEE Electron Device Letters, Vol. EDL-1, No. 7, July 1980, pp. 131–133. Nevertheless, mid-gap states are always present that result in unacceptable dark current for room temperature operation of silicon-based low-light-level image sensors.

A further problem with prior detectors arises from their spectral response characteristics. A large mismatch between the photoresponse required to facilitate CIE (Commission International de LeClairage) chromaticity and the actual spectral response of silicon photodetectors is illustrated in FIG. 1. Enabling color reconstruction to minimum CIE specifications for best color fidelity requires high, broadband response from about 380 nm to 780 nm. The photoresponse for scientific-grade silicon detectors instead extends to the bandgap of silicon, at beyond 1 $\mu$m. As FIG. 1 shows, maximizing the photo-response in the red part of the spectrum typically tends to compromise blue response and vice versa. For example, compare the response curve 16 of the "MIT EPI" device, as compared to response curve 18 of the "MIT High-rho" (i.e., high-resistivity) device, in FIG. 1. (Both devices are available from Lincoln Laboratory of Massachusetts Institute of Technology, in Lexington, Mass.) The high-rho device shows markedly better red response, while the EPI device is more sensitive in the blue region, but neither is inherently color balanced.

In addition to chromaticity problems with conventional detectors, the unneeded photoresponse in the near infrared from 780 nm to beyond 1 $\mu$m creates the requirement for an "infrared-blocking filter" in such cameras to suppress the photoresponse beyond the CIE requirement, thereby increasing both camera cost and complexity. Finally, absorption of photons in silicon via its indirect bandgap mandates thick detectors and/or significant modifications to CCD and CMOS processes for monolithic imagers to fully absorb the longer wavelength photons. This thickness requirement effectively increases the depletion volume subject to dark current generation, thereby further increasing the minimum dark current. The decreasing absorption at longer wavelengths also increases the signal processing required for maximizing color fidelity because of the resulting crosstalk from pixel to pixel and color level imbalance.

SUMMARY OF THE INVENTION

In view of the above problems, the present invention is a high-sensitivity photodetector for detecting radiation in the visible or shorter wavelength regions of the spectrum, suitable for operation at room-temperature. The photodetector includes (a) a compound semiconductor photodiode which generates a detector current in response to incident photons, the photodiode biased below its avalanche breakdown threshold, comprising III–V elemental components and having a bandgap with transition energy higher than the energy of infrared photons; and (b) a detector interface circuit at each pixel, arranged to receive a signal from the photodiode junction and to amplify said signal.

Preferably, the photodetector has its photodiode junction integrated in a first microstructure on a first substrate, and its interface circuit in a second microstructure on a second substrate. The first and second microstructures are then joined in a laminar, sandwich-like structure. The first and second microstructures communicate via electrically conducting contacts.

In one embodiment, the photodetectors are integrated in an imaging array for use at room temperatures to detect images from low-level visible, ultraviolet or shorter illumination, and suitable for use at video frame rates. Such imaging array is made up of a plurality of addressable photodetecting cells. Each cell includes a compound semiconductor photodiode which linearly generates a detector current in response to incident photons, the photodiode biased below its avalanche breakdown threshold, comprising III–V elemental components and having a bandgap with transition energy higher than the energy of infrared photons. Each cell also includes a high trans-impedance interface circuit at each pixel, arranged to receive a signal from the photodiode junction and amplify the signal.

In some embodiments, the interface circuit of at least some cells have independently variable gain. Thus, the gain at each pixel can be set to compensate for non-uniform photodiode response across the array.

The photodetector and array of the invention provide single-photon sensitivities, with higher signal-to-noise ratios at video frame rates and room temperature than previously possible, for detecting and imaging radiation in the visible region of the spectrum.

These and other features and advantages of the invention will be apparent to those skilled in the art from the following detailed description of preferred embodiments, taken together with the accompanying drawings, in which:

BRIEF DESCRIPTION OF THE DRAWINGS

FIG. 9 is a graph of dark current (on a logarithmic scale) as a function of temperature in degrees Kelvin (on a linear scale), for typical photodetector devices in accordance with the invention, and for typical conventional devices for comparison.

DETAILED DESCRIPTION OF THE INVENTION

The invention includes a photodetector device and amplifying interface circuit that can render high performance in low-light conditions (in photon flux levels on the order or single photon per sampling period) in the visible or shorter wavelength regions of the spectrum. This invention can effectively detect incident photons that impinge either on discrete photodetectors or on specific pixels in an imaging array. In one embodiment, suitable for video or still frame imaging in low light conditions, a plurality of such photodetector devices and interface circuits are preferably fabricated in a matrix to provide an imaging sensor of multiple pixels.

Figure 1:
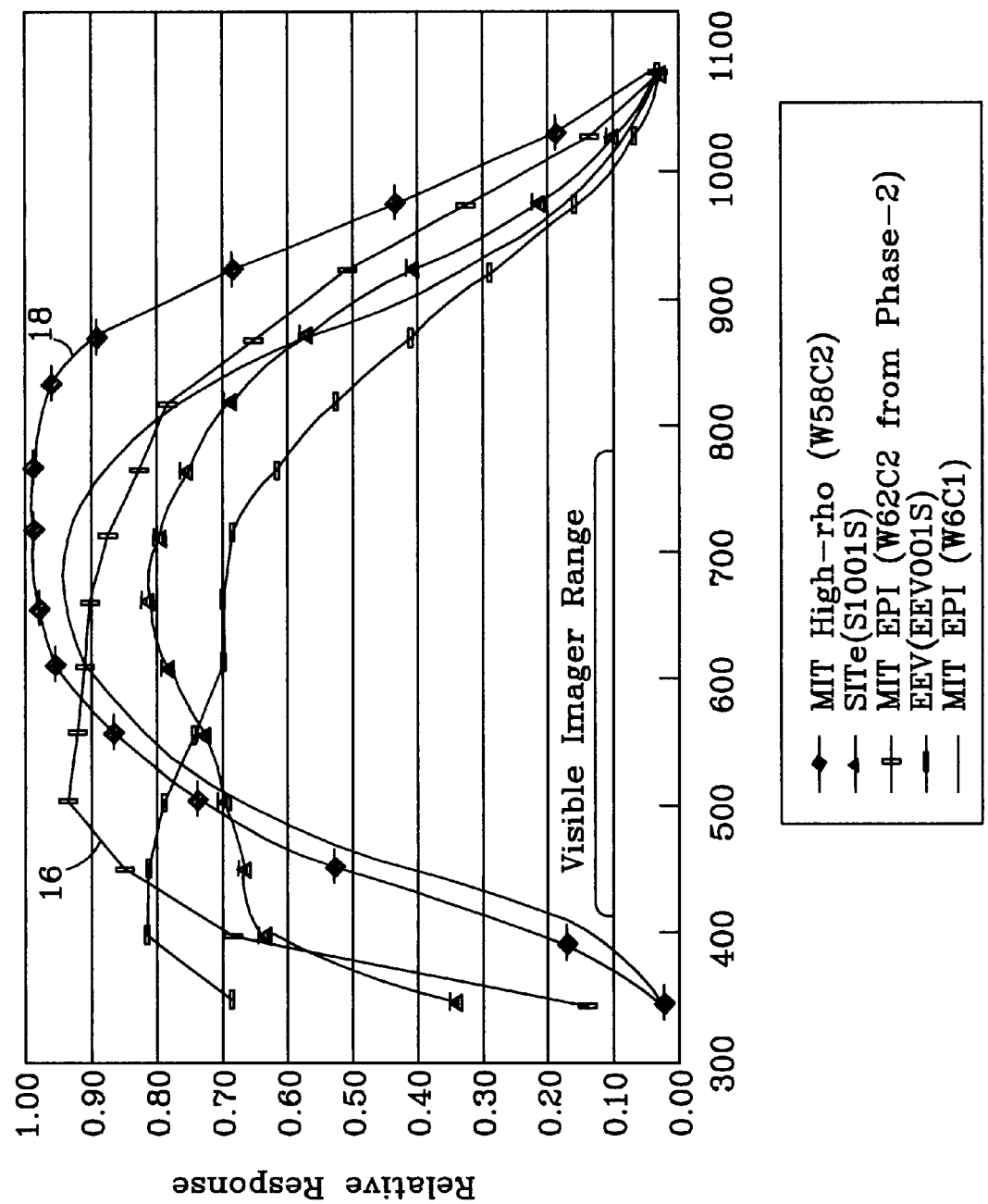
FIG. 1 is a graph of relative spectral response as a function of incident wavelength for various prior semiconductor photodetectors.
Figure 2:
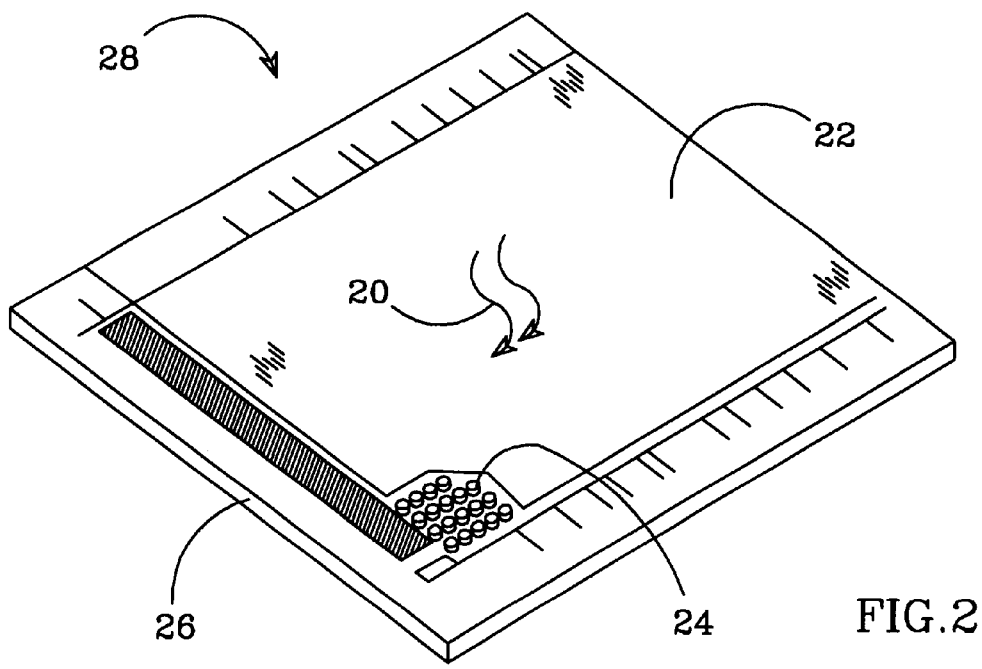
FIG. 2 is a perspective view of an array of photodetector devices in accordance with the invention.

An example of an imaging matrix of devices in accordance with the invention is shown in FIG. 2. Photons 20 (with energy hv, where v is the frequency and h is Plancks constant) impinge upon a photodetector layer 22, which includes multiple detector pixels. The photodetector layer 22 is preferably grown using molecular beam epitaxy or organo-metallic chemical vapor deposition (MOCVD), for example, on a transparent detector substrate, to define a plurality of independent photodiode detectors. The detector layer 22 is partially cut away in the illustration to better show multiple interlayer interconnection bumps 24 (typically indium bumps). Underlying the bumps 24, and communicating with layer 22 by means of the bumps 24, is an interface layer 26 in which a plurality of independent interface circuits are fabricated, preferably by using high-quality EPI or neutron transmutation doped wafers with a thin oxide to provide adequate threshold voltage $V_T$ uniformity. The photodetection layer 22 is preferably "flip-chip" mounted to the interface layer 26, using the interconnecting bumps 24 to connect photodiodes to respective interface circuits. For a more detailed description of a technique which can suitably be used to mount the layers, see U.S. Pat. No. 5,627,112 to Tennant et al. (1997). A portion 28 of the interface layer is also used for readout and addressing electronics.

Figure 3:
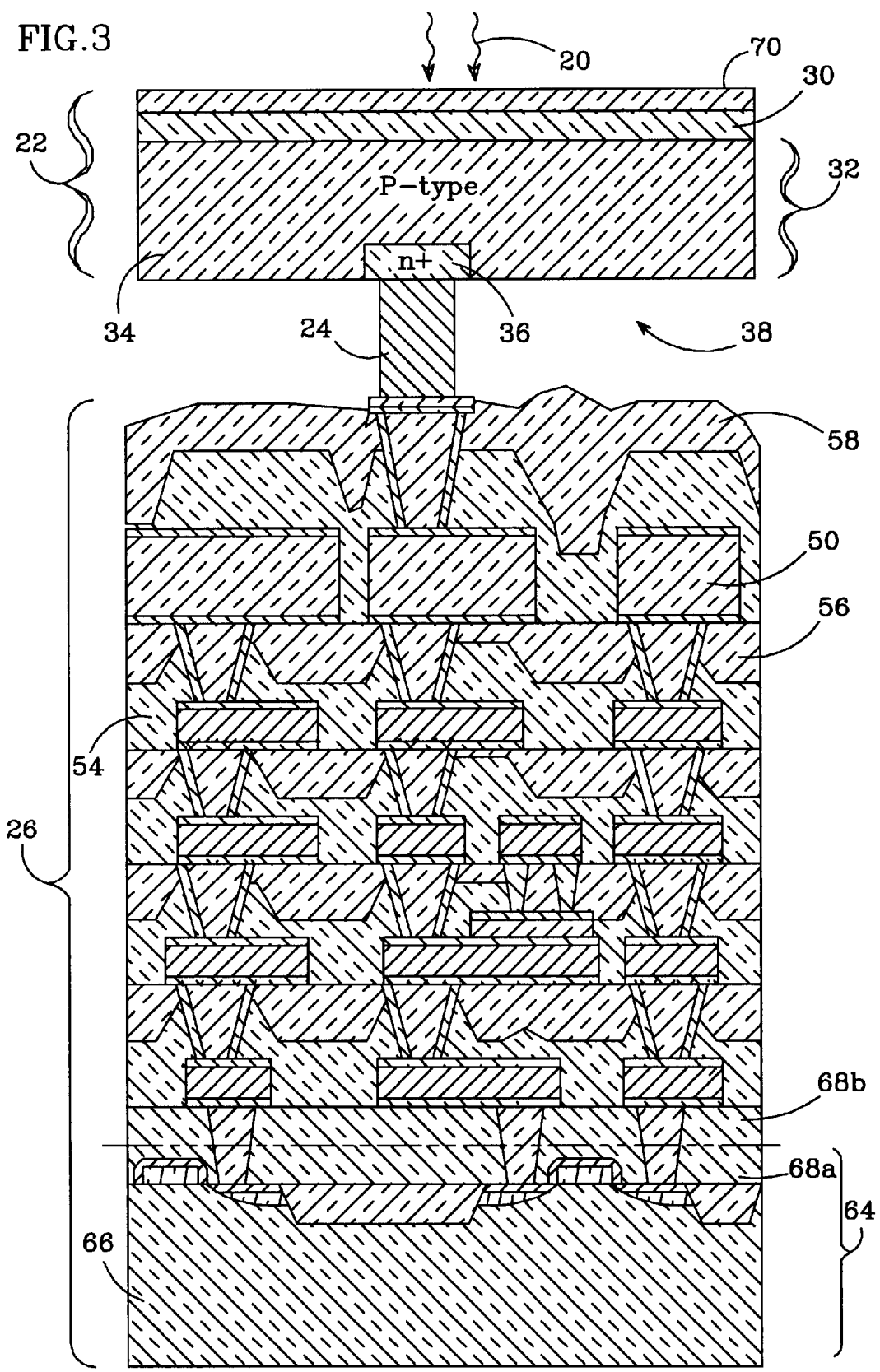
FIG. 3 is a magnified cross-sectional view of a representative portion (pixel) of the array of FIG. 1.

The cross-sectional view of FIG. 3 shows a small region of the imaging matrix of FIG. 2. The photodetection layer 22 includes a detector substrate layer 30 and a Bandgap-engineered detector layer 32, which communicates with the interface circuit layer 26 via the metal (typically indium or solder) bumps 24. It should be understood that in this context, a "layer" refers in general to a semiconductor wafer having multiple sublayers according to the various fabrication steps applied, rather than a single homogeneous layer. Accordingly, detector layer 32 includes suitably a "p doped" region 34 and an "n+ doped" region 36, together forming a photodiode. Although this arrangement is convenient for fabrication, the p and n regions could equivalently be reversed, to form a photodiode with opposite junction polarity, as will be easily recognized.

The interface layer 26 preferably underlies the detector layer 22, to which it is bonded and communicates via the conductive "bumps" 24 (only one of many is shown, for clarity), so that the layers lie one upon the other in a laminar fashion, much like a sandwich. It is advantageous to arrange the detector layer as shown in the figure, nearest the incident radiation, in order to maximize optical fill factor and avoid any limitation of the aperture (active surface) which otherwise might be masked by metallization layers.

The detector layer 26 includes multiple metallization layers such as 50 and 52, which are fabricated with suitable circuit paths, according to conventional photolithographic or similar techniques, to connect the various active and passive components of the interface circuitry (further described below in connection with FIGS. 5 through 7). Conventional oxide layers 54 and planarization material layers 56 are also present to define and separate conventional integrated circuit paths and components. An overglass layer 58 preferably is added to protect the circuitry during the flip chip bonding process.

Any number of layers of conventional metallization or other fabrication layers may be included in the layer 26, as required to fabricate the desired interface circuit. For clarity, details are omitted, but it should be understood that the cutaway region 60 may comprise multiple and complex fabrication layers. Typically 5 or six layers would be adequate to service the interface circuitry.

The lowest layers should typically include the MOS active components 64 on a (typically silicon) substrate 66. Shallow trench isolation and deep sub-micron CMOS processes should preferably be used to limit the size and inherent capacitance of the active devices, and thereby increase the operating speed while reducing pixel size of the detector cells. In accordance with conventional fabrication technique, the MOS component layer 66 is preferably separated from the overlying metallization layer by polycrystalline silicon ("polysilicon") layers 68a and 68b.

Optionally, the uppermost surface of the photodetector layer (nearest to the incident light) can be coated with a suitable optical coating 70, to reduce reflection due to refractive index mismatch, or to correct or customize spectral response. Microlenses can also (optionally) be formed on the uppermost surface of the photodetector layer to maximize the collection of light impinging on each pixel while facilitating minimization of detector capacitance and/or the number of defective pixels by minimizing the captive cross-section of various defects.

In accordance with the invention, the bandgap in the photoreceptive region of the photodiode 38 should be tuned to a level high enough to select for visible or shorter wavelengths. The most desirable bandgap will depend upon the exact intended environment and application of the device, which can be somewhat customized. For visible light operation, the photodiode 38 should preferably be fabricated with a bandgap of at least 1.7 eV. This will produce dark currents at room temperature which are at least several orders of magnitude lower than conventional silicon photo-diodes (with 1.1 eV bandgap).

Table 1 shows suitable detector and substrate layers for various cutoff wavelengths and corresponding bandgaps as desired for various applications. These materials are recommended, but equivalent materials could be substituted without departing from the invention.

Materials chosen from columns III and V of the periodic table are preferred because they are known to allow engineering of bandgaps in the desired regions, as exemplified in Table 1.

TABLE 1

| Cutoff Wavelength (nm) | Bandgap (eV) | Detector Layer | Detector Substrate |
|---|---|---|---|
| 625–700 | 1.77–1.98 | AlGaAS | GaAs |
| 600–625 | 1.98–2.07 | AlInGaP | InP |
| 550–600 | 2.07–2.25 | GaP | InP |
| 250–550 | 2.25–4.96 | InGaN | Sapphire |

III–V semiconductors have several advantages for application as photodetectors for visible imaging systems. It is very desirable for detectors to have a direct band gap semiconductor, so that the photons are efficiently and quickly absorbed. The band gap should be slightly lower energy than the energy of the desired photon, so that thermal generation of carriers across the band gap, which is undesirable, is minimized. By suitable choice of the III–V alloy composition, direct band gap semiconductors with gap energies covering the near infrared, visible and near ultraviolet can be realized.

Another requirement for good detectors is low defect density. For minimum defect density, growth on a lattice-matched substrate is desirable. Both GaAs and InP substrates are commercially available, and are of high quality. InGaAsP can be precisely lattice-matched to GaAs, allowing arbitrary thicknesses of the material to be grown without developing strain-related dislocations. The band gap of lattice-matched InGaAsP covers the wavelength range of 0.67 microns to the GaAs gap at 0.89 microns. AlGaAs can be approximately lattice matched to GaAs, allowing a few microns of AlGaAs to be grown with minimal generation of strain-induced dislocations. While high aluminum content AlGaAs is indirect gap, the direct gap compositions of AlGaAs cover approximately the same wavelength range as InGaAsP.

A range of materials can be grown that are exactly lattice-matched to InP substrates. AlInAsP can cover the wavelength range from 0.82 to 0.91 microns. GaInAsP can cover the wavelength range from 0.91 to 1.78 microns. GaSb substrates also exist, although they are not as highly developed as GaAs and InP substrate technology.

For higher wavelength radiation, AlGaN alloys have gaps that range from 0.2 microns for AlN to 0.36 microns for GaN. GaInN extend this range to 0.62 microns.

Another advantage of these III–V alloys is that wider band gap material can usually be placed on the illuminated side of the photo-diode, so that the incident photons are absorbed in the desired depletion region of the photo-diode, rather than in the doped contact region. These wider gap windows improve the quantum efficiency of the detectors.

For those applications where the desired wavelength is of higher energy than the band gap of the substrate and the radiation is incident from the back-side, there are a variety of techniques for removing the substrate used to grow the photo-detectors. This substrate removal can be done at the wafer-level, in which case the epitaxial layers would need to be attached to another substrate for mechanical reasons, or it can be done after hybridization, in which case there is no need for further mechanical support.

The dark current, $I_{gr}$, produced by a photodiode in accordance with the invention will be dominated by generation-recombination mechanisms and thus vary as a function of temperature, bias voltage, and bandgap, approximately according to the equation:

$$I_{gr} \approx \frac{q n_i A W}{\tau_{\it{eff}}}$$

where q is the electronic charge, $\tau_{\it{eff}}$ is the effective carrier lifetime, $n_i$ is the intrinsic carrier concentration, A is the surface cross-sectional area of the depletion region boundary and W is the depletion width for an abrupt one-sided junction. The variation of $I_{gr}$ is expected to be mostly dominated by the intrinsic carrier concentration. The concentration is governed by:

$$n_i \propto e^{-\frac{E_g}{2kT}}$$

where $E_g$ is the bandgap and the quality of the material is represented in the term $\tau_{\it{eff}}$.

To produce a practical low-level detector at a given temperature, therefore, the bandgap should be engineered to produce dark currents at the desired temperature which are lower than the photodetector's single photon current output. For example, for temperatures in the region 280–300 degrees kelvin, which roughly corresponds to common ambient temperatures, an AlGaAs detector on a lattice matched GaAs substrate can be engineered to produce a 1.77 eV bandgap, which would produce approximately $10^{-19}$ Amp. dark current for a 400 micron$^2$ detector area. Such devices are capable of supporting detection of single quanta of visible light by being distinguishable over the dark current noise.

Figure 4:
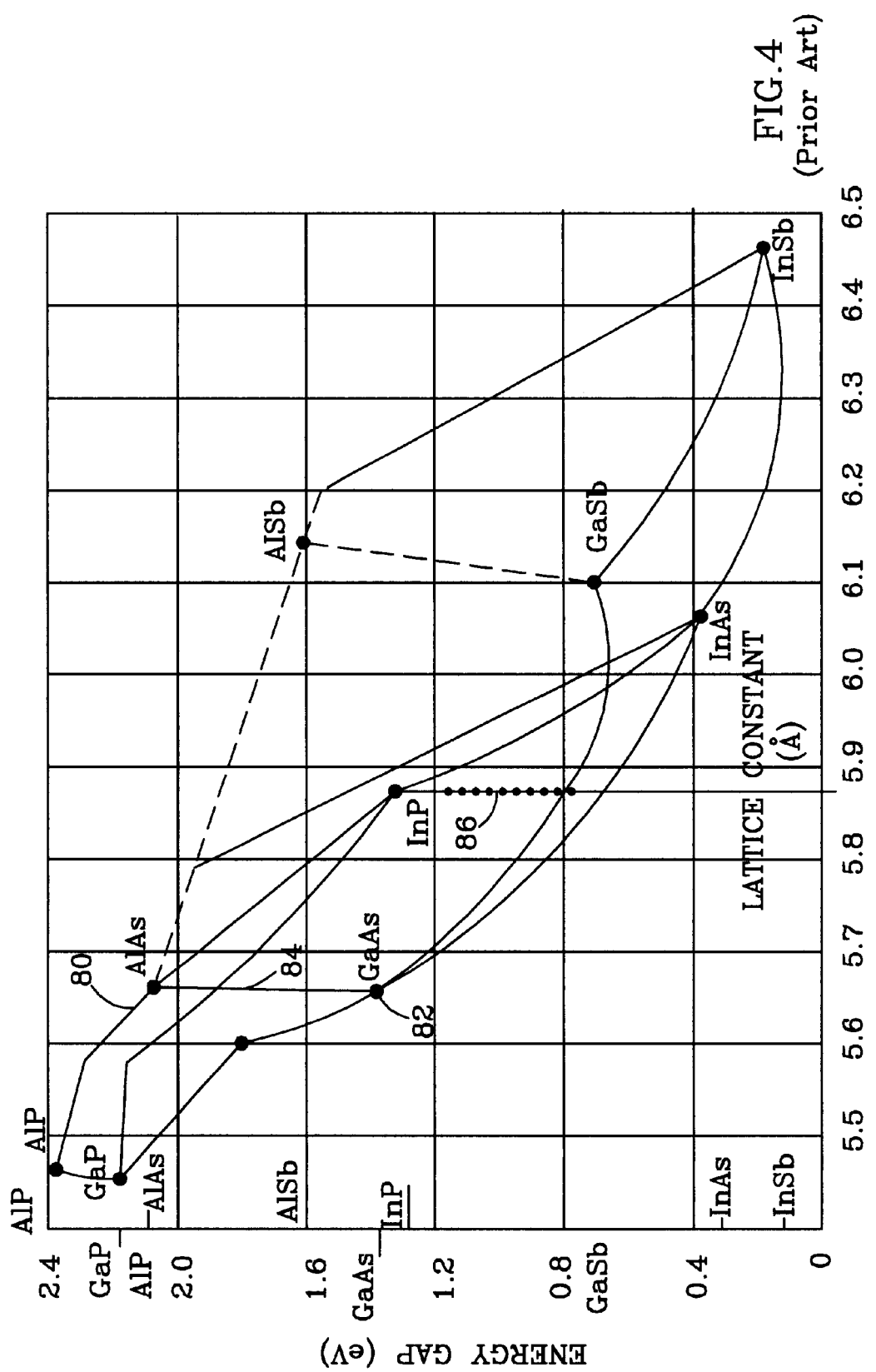
FIG. 4 is a graph of bandgap energy vs. lattice constant for various known compound semiconductors, with points representing binary compounds and lines representing achievable bandgap-lattice relationships for ternary and quaternary compounds.

FIG. 4 shows energy bandgap vs. lattice constant for a variety of III–V semiconductor compounds, including those listed in table 1. Several lattice matched systems can be identified from the diagram. Binary compounds are shown as points, such as the AlAs point shown at 80 and the GaAs point at 82. Ternary and quaternary compounds can be formed with properties intermediate between the binarys: for example, the line 84 between AlAs and GaAs represents achievable bandgap and lattice constants for AlGaAs compounds with mixtures intermediate between the AlAs and GaAs extremes (also referred to in table 1, above). Similarly, The line 86 represents a continuum of bandgap-lattice constant relations achievable with GaInAsP materials; line 88 shows bandgaps and lattice constants achievable with AlGaP. Other compound materials can be formulated, as will be evident from the diagram and from known technology.

Figure 5:
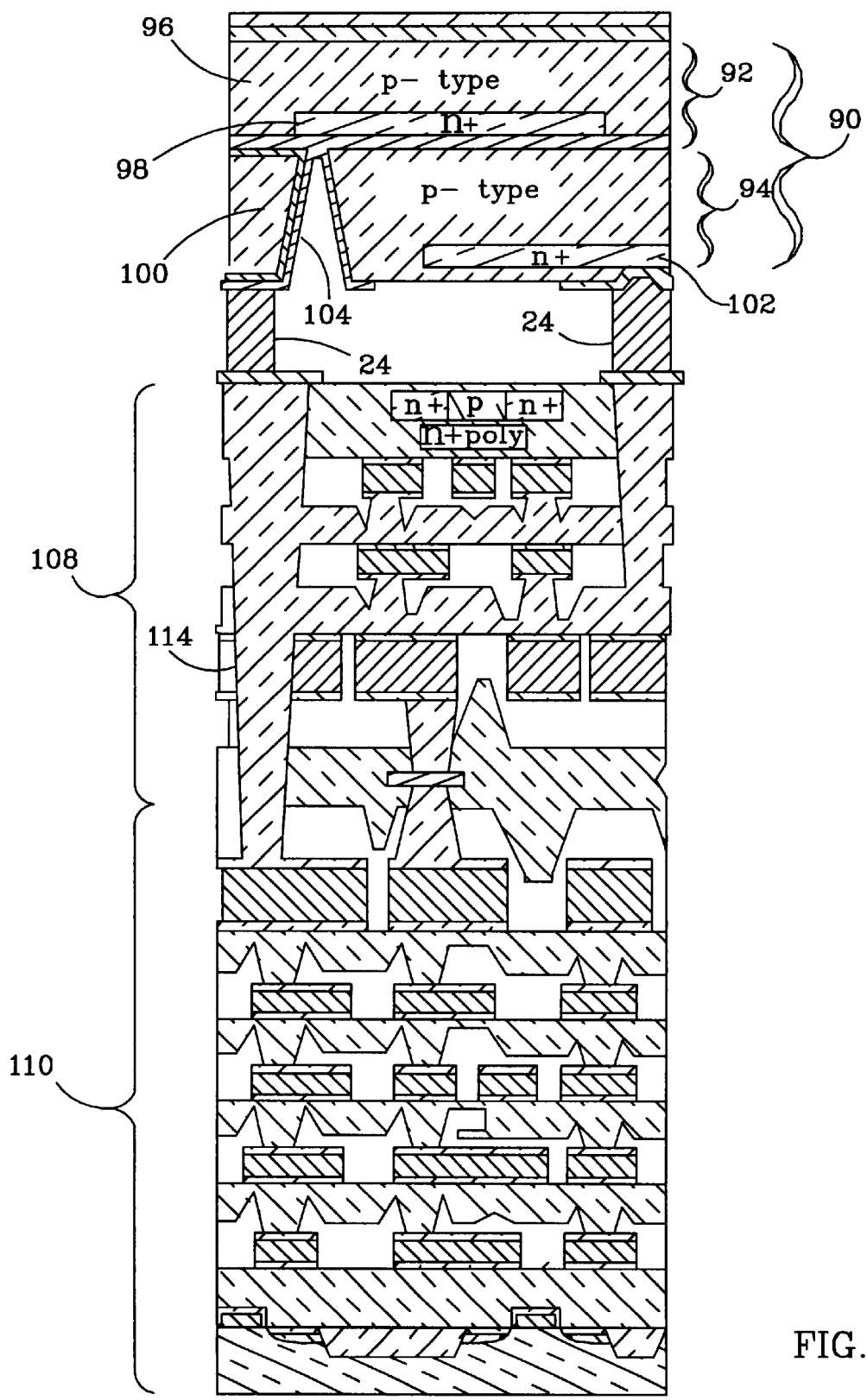
FIG. 5 is a cross-section of an alternate variation in accordance with the invention, suitable for multi-spectral detection and discrimination.

FIG. 5 shows a cross section of an alternate embodiment of the invention, capable of multi-color (or more generally, multi-wavelength) discrimination, suitable for use in a spectral-discriminating imaging matrix. The photodetector layer 90 in this embodiment includes a plurality of distinct photodiode junctions such as 90 and 92, preferably disposed one above the other, layered in a laminar fashion. In the example shown, the photodiode 92, which includes p layer 96 and n+ layer 98, are disposed on top of a second photodiode 94 made up of second p layer 100 and second n+ layer 102. Preferably, the second (underlying) photodiode 94 should be engineered from materials to produce a lower bandgap than the first (overlying) photodiode. Thus, wavelengths which are too long to be absorbed by the upper photodiode will penetrate the upper photodiode and be absorbed by the lower photodiode. As in the embodiment of FIG. 2, the photodiode signals are passed to the interface circuitry by conductive (typically indium) bumps 24. The photodiode outputs are isolated from one another: this is accomplished suitably by providing a top layer interface circuit and a bottom layer interface circuit 110, with the output of the one of the photodiodes 92 or 94 passing by via 114 to the lower interface circuit 110. Both interface circuits are preferably fabricated in CMOS, employing shallow trench isolation in deep sub-micron silicon.

Although only two photodiodes 92 and 94 are shown, to maintain clarity, three or more photodiodes can be used, as appropriate to a particular application. For example, a three-spectral-band detector would be desirable to discriminate three primary colors of visible light, for use in a color imaging device. To enhance color discrimination, the collecting area for each color layer can be varied to equalize or customize color sensitivity. Color filters can also be used in combination with the varying bandgap detector materials to customize color sensitivity as desired.

Facilitating fully registered three-color detection in this manner eliminates the spatial and color aliasing that occurs with conventional devices facilitated via opto-mechanical alternative means such as multi-faceted prisms (where at least three single-color imagers are each situated at a minimum of three facets and precisely coregisted) or spinning color wheels (where multiple exposures are used to form the precisely registered color information).

To realize sufficient signal with low incident light, the photodetector described above will typically require amplification by a high gain, circuit or low, which is preferably fabricated using integrated complementary metal-oxide semiconductor (CMOS) technology (although nMOS or pMOS could also be used). Preferably, one interface circuit per pixel is provided. As previously discussed, fabrication of the CMOS interface layer(s) 28 can be performed separately from the fabrication of the photodetection layer 22, then the layers connected via bump bonding, as described in U.S. Pat. No. 5,627,112 or by equivalent methods.

Figure 6:
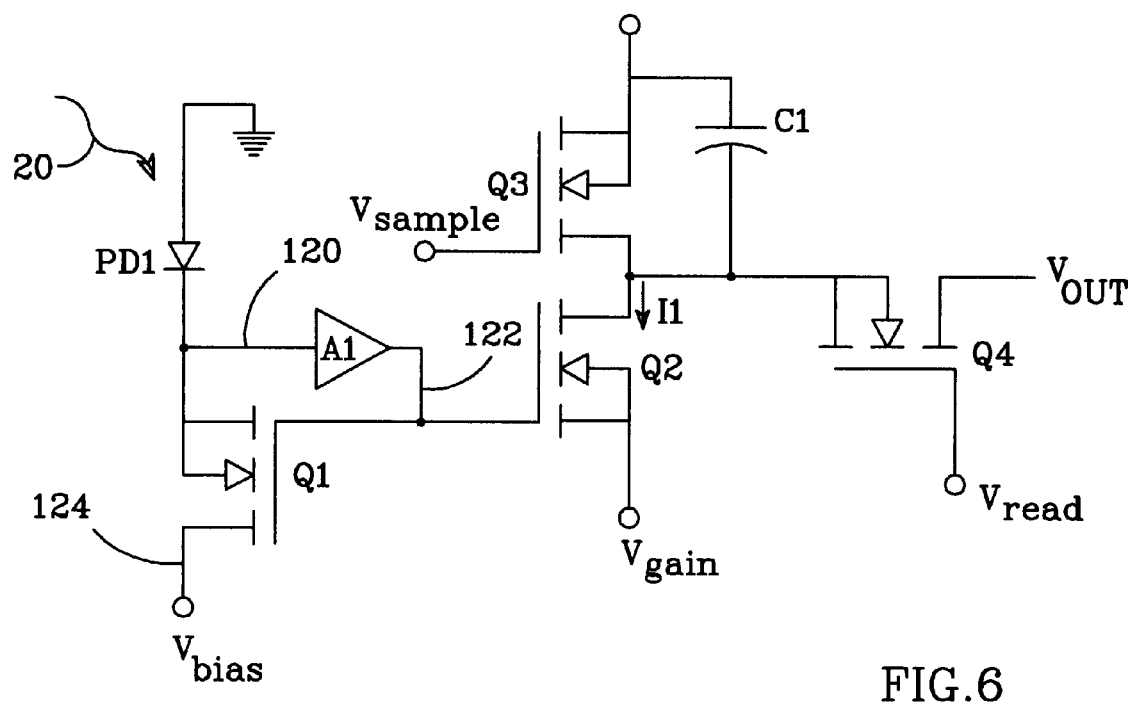
FIG. 6 is a schematic diagram of a circuit suitable for use as the interface circuit in FIG. 2 or 4.

FIG. 6 shows one example of a suitable interface circuit (or "readout circuit"), which can be fabricated in CMOS technology in layer 28 and which provides sufficient gain to read out single photon events at video frame rates. The low impedance circuit is similar to that disclosed in U.S. Pat. No. 5,929,434 to Kozlowski et al.

A high-gain amplifier A1 is connected in a negative feedback configuration from the source to gate of load FET Q1 to minimize the input impedance. In particular, the amplifier's input 120 is connected to the source of Q1, and its output 122 is connected to the gate of Q1. The amplifier A1 can suitably be a single-ended inverting amplifier or a differential amplifier, as further discussed in U.S. Pat. No. 5,929,434. The voltage $V_{bias1}$ at node 124 is preferably set to a voltage which ensures that the FET Q1 operates in its subthreshold region. In this region, the FET's transconductance is very small, which is necessary to achieve high current gain via the ratio of the transconductances of Q2 to Q1.

The photodiode PD1 is a compound semiconductor photodiode, bandgap-engineered to provide the proper bandgap as described above in connection with FIG. 3 and Table 1. The photodiode PD1 is preferably reverse-biased in the region below the avalanche breakdown threshold (sometimes called the "linear region" although linearity is not absolutely required by the invention). When a photon 20 (with energy hv) falls on the photodiode PD1, charge is injected into node 120, connected to the source of Q1, resulting in a small signal. The amplifier A1, which is connected in a negative feedback configuration from the source to the gate of Q1, amplifies the small signal and causes the voltage at the gate of Q1 to follow the small signal at node 120, so that the gate-to-source voltage remains substantially constant across Q1 and the small signal at 120 appears also at node 122. See U.S. Pat. No. 5,929,434 for a discussion of the merits of the A1-Q1 buffering circuit, which include insensitivity to 1/f FET noise.

The signal at node 122 is further amplified by the FET Q2, causing the much larger source-drain current I1 to discharge capacitor C1. The voltage across C1 therefore approximates an integral of the (amplified) small signal output of the photodetector, where the integration is over time. FET Q3 is used to reset the voltage across capacitor C1 during an initialization period or between samples, but remains off (approximating an open switch) during sampling integrations. The sampling period is controlled by $V_{sample}$, the voltage applied to the gate of Q3. FET Q4 also acts as a switch, and is held in its high impedance ("open") state during integration, then switched to its low impedance ("Closed") state periodically by Vread, to read out the integrated voltage (preferably once per sampling period, at the end of the period). Gain of the circuit can be varied by adjusting the transconductance ratio of Q2 to Q1, or by adjusting the time window during which the circuit integrates photonic signal.

Alternate interface circuits are known which are similar to that of FIG. 6 but which provide a more predictable current gain which is independent of scene illumination. For example, one such circuit is disclosed in U.S. Pat. No. 5,929,434 (discussed in Col. 5, line 49 through Col. 6, line 23 and shown in FIG. 3 of that patent).

Figure 7:
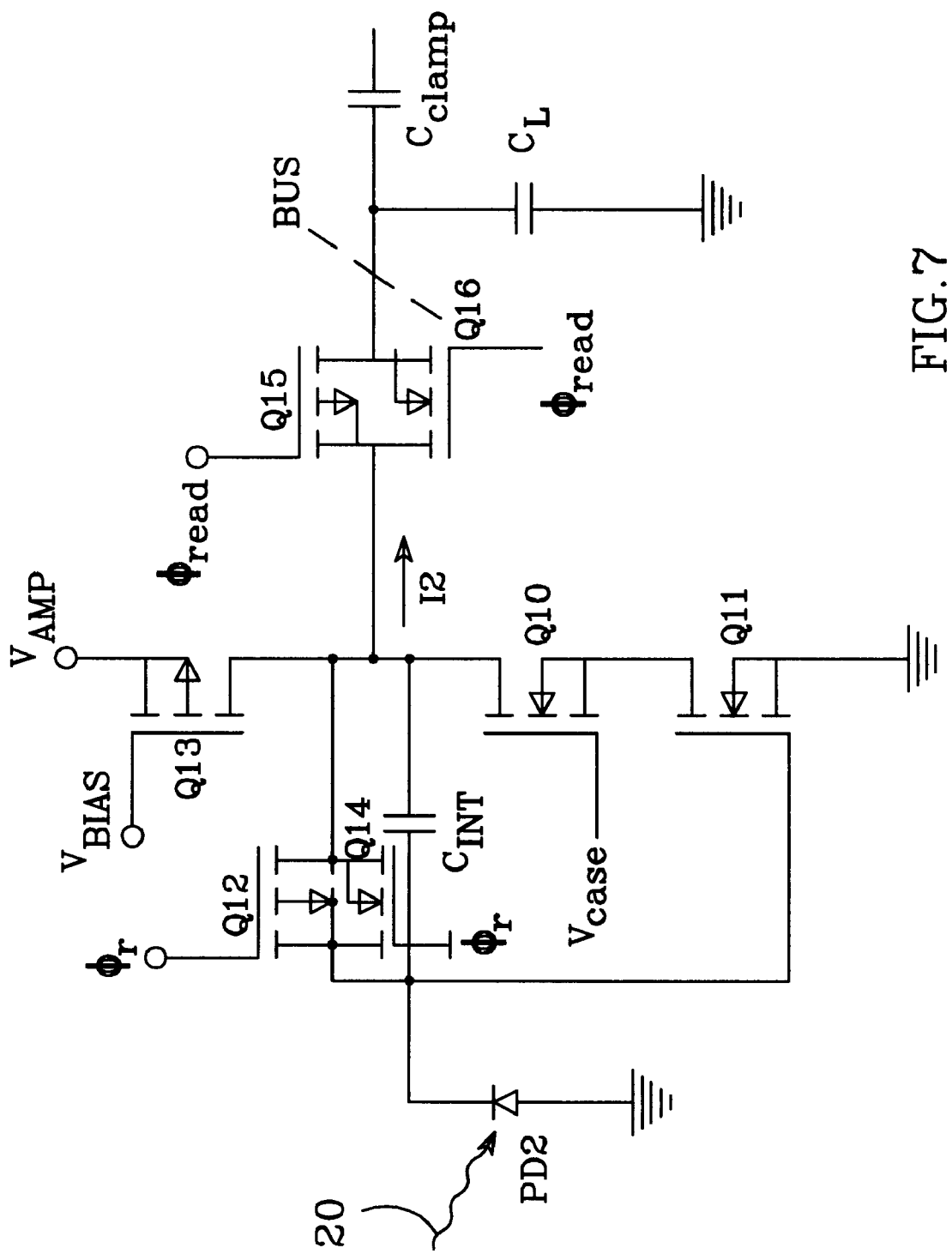
FIG. 7 is a schematic diagram of an alternate interface circuit using a capacitively coupled, CMOS transimpedance amplifier.

FIG. 7 shows an alternate interface circuit with low input impedance which provides very low noise and high gain by using a capacitively coupled, CMOS transimpedance amplifier that is optimized for low-light-level imaging. In this circuit, photodetector signal from PD2 is amplified by FETs Q10 and Q11, which are connected in a cascode configuration. The cascode inverter amplifier configuration, which comprises FETs Q10, Q11 and load FET Q13, maximizes the compact amplifier's voltage gain and minimizes the Miller capacitance used for signal integration. During an initialization period, the CMOS reset switch consisting of complementary FETs Q12 and Q14 is switched on by complementary reset clock signals $\phi_r$ and $\overline{\phi_r}$, thereby discharging any integrated signal stored on $C_{int}$. The CMOS reset switch minimizes dc offsets generated by feedthrough of the reset clock to the detector node. $C_{int}$ represents the gate-to-source overlap capacitance of Q11, which is 300–400 aF per micron of FET width for 0.25 $\mu$m CMOS technology.

Further mitigation of switching feedthrough is achieved by shaping the reset clocks and the pixel readout clocks ($\phi_{read}$ and $\overline{\phi_{read}}$). The shaping optimizes the slew rate to perform the necessary clocking at minimum feedthrough. Degradation of readout speed resulting from the shaping of ($\phi_{read}$ and $\overline{\phi_{read}}$) is mitigated by increasing the amplifier bias during readout to briefly reduce its output impedance.

Since the voltage gain of such a CMOS amplifier is significantly greater than 1000 and the III–V photodiode has capacitance less than 15 fF for the configuration of the preferred embodiment, $C_{int}$ of approximately 0.5 fF is thereby facilitated. The resulting photo-gain for the amplifier can thus be greater than 300 $\mu$V/e–, which is twenty to sixty times larger than achieved with CCDs.

Similarly, a CMOS transmission gate consisting of complementary FETs Q15 and Q16 enables the amplified signal to charge $C_L$, which serves to band-limit the signal and thereby suppress the wide-band noise of the transimpedance amplifier. Since this configuration enables much larger $C_L$ than otherwise achievable within the pixel by exploiting the parasitic bus capacitance in conjunction with any additional band-limiting capacitance shared among all the pixels on the bus, the high frequency noise boost of this amplifier configuration is mitigated and <1 e– noise is facilitated.

The noise transfer function for the transimpedance amplifier of FIG. 7 is:

$$\frac{v_o}{i_n} = \frac{C_{det} + C_{int}}{G \cdot C_{int}} \cdot \frac{1}{1+s\tau}; \quad \tau \approx -\frac{C_L(C_{det} + C_{int})}{GC_{int}}$$

where $C_{det}$ is the total detector and input capacitance, and G is the amplifier gain. The amplifier's noise equivalent charge is:

$$N_{eq} = \frac{\langle v_o^2 \rangle C_{int}}{q}; \quad \text{where}$$

$$\langle v_o^2 \rangle^{1/2} = \sqrt{\int_0^\infty 4kT|G||H_n(s)|^2 df}$$

$$= \sqrt{4kT|G|\left(\frac{C_{det}+C_{int}}{G \cdot C_{int}}\right)^2 \int_0^\infty \left|\frac{1}{1+s\tau}\right|^2 df}$$

The integral under the radical is equivalent to $1/4\tau$ where $$\frac{1}{4\tau} = \sqrt{\frac{kT}{C_{int}} \cdot \frac{(C_{det}+C_{int})^2}{C_L(C_{det}+C_{int})+C_{int} \cdot C_{det}}}$$

Substituting, the output-referred amplifier noise voltage is:

$$\langle v_o^2 \rangle^{1/2} = \sqrt{\frac{kT}{C_{int}} \cdot \frac{C_{det}+C_{int}}{C_L + \frac{C_{int} \cdot C_{det}}{C_{det}+C_{int}}}}$$

Alternatively expressing the output-referred noise in terms of electrons, the amplifier's wideband thermal noise, or channel noise, is:

$$\therefore N_{channel} = \frac{1}{q}\sqrt{kTC_{int} \cdot \frac{C_{det}+C_{int}}{C_L + \frac{C_{int} \cdot C_{det}}{C_{det}+C_{int}}}}$$

where q is the electron charge, k is Boltzmann's constant and T is the operating temperature. Channel noise of about 1 e– can be achieved with $C_{det}$ of 15 fF and $C_{int}$ of 0.5 fF at 295K for CL of ~1.23 pF. Since this is comparable to the bus capacitance for a typical video-format imager, no additional capacitance is needed.

The preceding analysis does not include the amplifier 1/f noise which increases inversely with the amplifier gate area. The amplifier configuration must therefore be long and narrow to minimize both 1/f noise and overlap capacitance.

The preceding analysis also does not consider the reset noise associated with resetting $C_{det}$ and $C_{int}$. Such noise is suppressed by the inverse square root of the amplifier's gain. The amplifier gain must therefore be greater than 2500 to reduce this noise source to one electron at room temperature for the specified capacitances. Such amplification is readily achieved in CMOS via the cascode configuration and thereby obviates the otherwise compelling need for correlated double sampling. This alternative therefore provides an extremely compact amplifier.

The band-limited output voltage from the compact amplifier is read from each pixel by applying the complementary clocks $\phi_{read}$ and $\overline{\phi_{read}}$ and thereby connecting the pixel's signal to a readout Bus. This allows the outputs of multiple such interface circuits to be multiplexed to a common bus, as for example in reading out an array or matrix of photodetectors.

Figure 8:
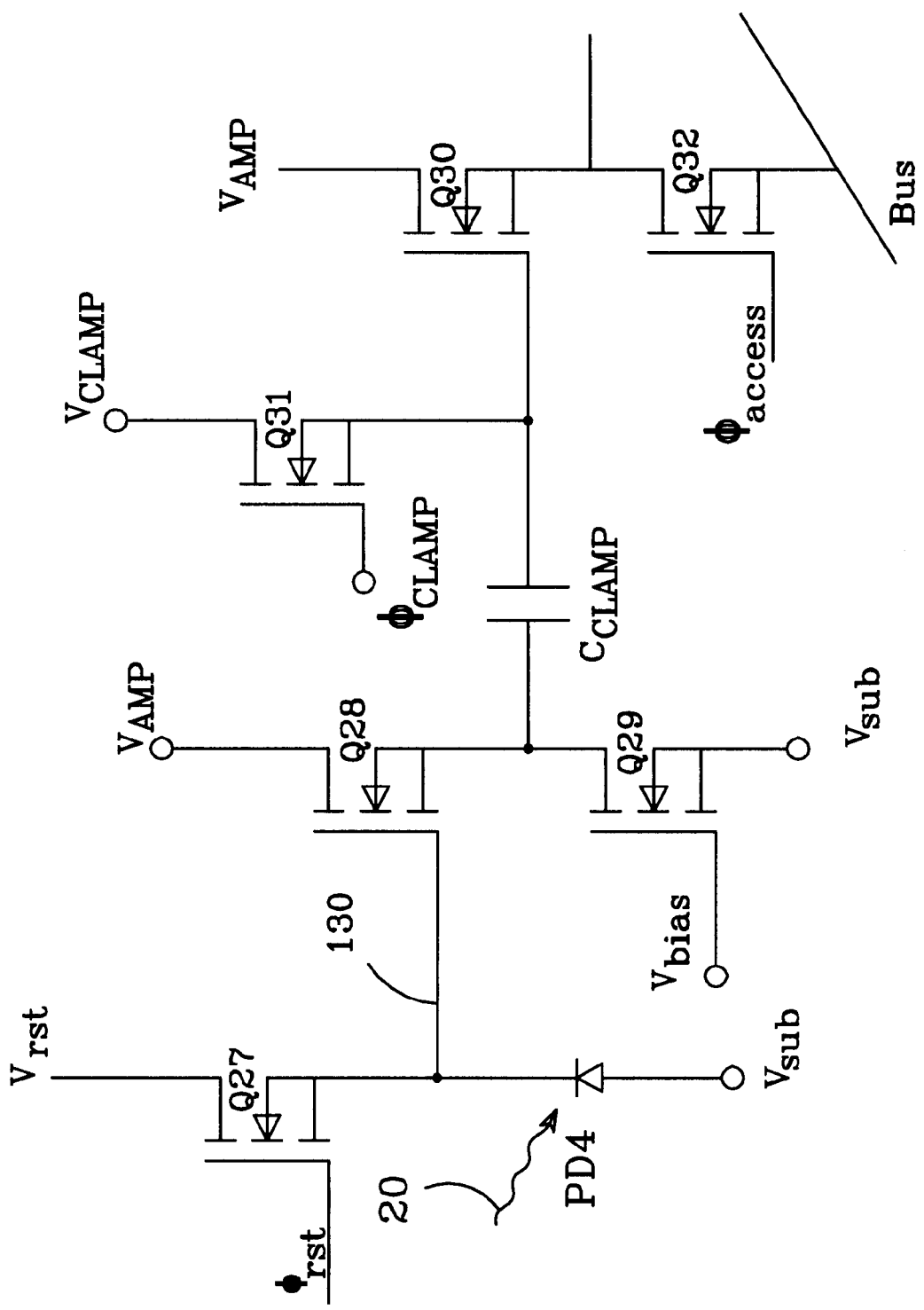
FIG. 8 is a another alternate interface circuit which uses an FET source follower amplifier to buffer and amplify the photodiode signal.

FIG. 8 shows an alternate interface circuit with high input impedance. The circuit uses a source follower amplifier to readout from the photodetector diode PD4. When $\Phi_{rst}$ is high, Q27 provides bias to the photodetector diode PD4. The signal developed during the integration time across PD4's capacitance at node 130 is amplified and buffered by source follower FET Q28, which is current biased by Q29. The voltage $V_{bias}$ (at the gate of Q29) is preferably set to bias Q29 in the subthreshold region to minimize its luminance, which would otherwise increase noise and compromise the available dynamic range. The output of the source follower FET Q28 is capacitively coupled by series capacitor $C_{clamp}$ initially, under control of a reset signal $\Phi_{clamp}$ applied to the gate of Q31.

The clamping and sampling facilitated in this manner effects correlated double sampling of the photogenerated signal that is subsequently read through the second stage source follower and offset by the voltage stored across $C_{clamp}$. The correlated noise generated by resetting the detector capacitance is thereby eliminated. By minimizing the capacitances of PD4 and the gate of FET Q28, the transimpedance is maximized for reading noise levels below about 10 e– at typical video rates. Since the maximum total capacitance of the III–V detector and the gate of FET Q28 is preferably ≦5 fF, a photoconversion gain of 32 μV/e–, the noise level for a background signal of one electron is about 32 μV rms. This is manageable since the noise bandwidth of the pixel amplifier can be limited to about ten times the maximum line rate, which is on the order of 100 kHz. The requisite white noise at this bandwidth is a manageable 0.1 μV/√Hz. The output of the pixel amplifier is read from the pixel by enabling $\Phi_{access}$ to supply the signal to the bus. The signal is appropriately band-limited to about 100 kHz via the parasitic bus capacitance $C_L$ (not explicitly symbolized) and (optional) additional capacitance external to the pixel, if such is necessary to reduce the amplifier's wide-band thermal noise, depending on the MOS process. The circuit of FIG. 8 is thus also capable of detecting quanta.

In one particularly attractive embodiment, a plurality of photodetectors according to the invention as previously described are integrated in a pixellated array or matrix. Independent interface circuits are most preferably provided for each pixel. By using a suitable variable gain interface circuit, for example as described above in connection with FIGS. 6, 7 and 8, independently variable gain can be provided for each pixel. The interface matrix can thus be fabricated with pixel gains varying from pixel to pixel in a manner complementary to any pixel to pixel variation (expected or measured) in photodetector sensitivity. Such photodetector variation might arise, for example, from processing inhomogeneities or irregularities.

One of the primary benefits of the invention is that it uses conventional photodiodes or photoconductors that have unity gain, rather than avalanche photodetectors. Such photodiodes of photoconductors are cheaper, more uniform, easier to fabricate, more reliable, less susceptible to noise and can be fabricated in alternative materials at a variety of cutoff wavelengths to specifically tailor the photoresponse to each application. A second benefit is the near absence of dark current at room temperature. At typical ambient temperatures, the dark current will be less than one quantum for the detector's pixel area (per sample time at video rates). A third benefit is the extremely small detector capacitance that can be achieved via the vertically integrated hybrid. This translates to lower read noise using easily produced photodetectors.

FIG. 9 demonstrates the dark current reduction achieved by the invention. A III–V detector capable of responding to 780 nm radiation, shown as the dark current vs. temperature line 180, has several orders of magnitude lower dark current than the best silicon CCDs. Further reducing the long cutoff wavelength to 650 nm to match the minimum red response needed for imagers with RGB color sampling rather than the full CIE specification reduces the dark current at room temperature by over six orders of magnitude (compared with conventional silicon CCDs), as shown by line 182. This reduction completely eliminates any need for imager cooling in the temperature range spanned by the data shown (up to at least 320 degrees K, and by extrapolation probably much higher). Included in the figure are representative data for conventional silicon photodetectors including various configurations available in standard CMOS-based imagers. Curve 184 shows the dark current density for a MPP CCD(multi-pinned phase charge coupled device, available for example from Sony Corp.), and curve 186 similarly shows dark current density for a CMOS N+ in P substrate CCD device. It is apparent from the figure that the dark currents obtained by the invention are several orders of magnitude lower than silicon CCDs in the relevant temperature range.

While several illustrative embodiments of the invention have been shown and described, numerous variations and alternate embodiments will occur to those skilled in the art. In an application where speed is a priority, the photodetector of the invention could be used at rates far exceeding typical video frame rates (given sufficient illumination). On the other hand, in applications requiring extreme sensitivity, sampling can be done at lower than video frame rates, providing much greater photonic sensitivity, at the expense of speed. Cooling could optionally be applied to obtain ultra-low dark current, low noise operation for extremely low light applications (for example, in astronomy). Such variations and alternate embodiments are contemplated, and can be made without departing from the spirit and scope of the invention as defined in the appended claims.

We claim:

1. A high-sensitivity photodetector for detecting radiation in the visible or shorter wavelength regions of the spectrum, suitable for room-temperature operation, comprising:

a compound semiconductor photodiode which generates a detector current in response to incident photons, said photodiode biased below its avalanche breakdown threshold, comprising III–V elemental components and having a bandgap with transition energy higher than the energy of infrared photons;

a high trans-impedance interface circuit, arranged to receive a signal from said photodiode junction and amplify said signal, wherein said photodiode junction is integrated on a first substrate and said interface circuit is on a second substrate.

2. The photodetector of claim 1, wherein said photodiode junction is integrated in a first microstructure on said first substrate, said interface circuit is in a second microstructure on said second substrate, and said first and second microstructures are joined in a laminar fashion, and wherein said first and second microstructures communicate via electrically conducting contacts.

3. The photodetector of claim 2, wherein electrically conducting contacts comprise indium.

4. The photodetector of claim 3, wherein said interface circuit comprises:

a load FET, having a source arranged to receive a small signal from said photodiode; and an amplifier that is connected in a negative feedback loop around said load FET's gate-to-source voltage.

5. The photodetector of claim 4, wherein said interface circuit further comprises:

a sampling circuit that samples the output of said amplifier, said sampling circuit comprising:

a capacitor that integrates the amplifier output;

an access switch which is clocked at a sampling frequency to read said output; and a reset switch to discharge said capacitor after said voltage is read.

6. The photodetector of claim 1, wherein said bandgap is at least 1.77 electron volts.

7. The photodetector of claim 1, wherein said bandgap is at least 1.98 electron volts.

8. The photodetector of claim 1, wherein said bandgap is at least 2.07 electron volts.

9. The photodetector of claim 1, wherein said bandgap is at least 2.25 electron volts.

10. The photodetector of claim 1, wherein said photodiode comprises:
   a detector layer comprising aluminum gallium arsenide; and
   a substrate layer comprising gallium arsenide.

11. The photodetector of claim 1, wherein said photodiode comprises:
   a detector layer comprising aluminum indium gallium arsenide, and a substrate layer comprising indium phosphide.

12. The photodetector of claim 1, wherein said photodiode comprises:
   a detector layer comprising gallium phosphide; and
   a substrate layer comprising indium phosphide.

13. The photodetector of claim 1, wherein said photodiode comprises:
   a detector layer comprising indium gallium nitride; and
   a substrate layer comprising sapphire.

14. An imaging array for use at room temperatures to detect images from low-level visible, ultraviolet or shorter illumination, suitable for use at video frame rates, comprising:
   a plurality of addressable photodetecting cells, each said cell comprising:
      a compound semiconductor photodiode which generates a detector current in response to incident photons, said photodiode biased below its avalanche breakdown threshold, comprising III–V elemental components and having a bandgap with transition energy higher than the energy of infrared photons;
      a high trans-impedance interface circuit, arranged to receive a signal from said photodiode junction and amplify said signal,
      wherein said photodiode is integrated on a first substrate and said interface circuit is on a second substrate.

15. The imaging array of claim 14, wherein said photodiode is integrated in a first microstructure on said first substrate, said interface circuit is in a second microstructure on said second substrate, and said first and second microstructures are joined in a laminar fashion,
   and wherein said first and second microstructures communicate via electrically conducting contacts.

16. The imaging array of claim 14, wherein said electrically conducting contacts comprise indium.

17. The imaging array of claim 14, wherein said interface circuit comprises:
   a load FET, having a source arranged to receive a small signal from said photodiode; and
   an amplifier that is connected in a negative feedback loop around said load FET's gate-to-source voltage.

18. The imaging array of claim 14, wherein said interface circuit further comprises:
   a sampling circuit that samples the output of said amplifier, said sampling circuit comprising:
      a capacitor that integrates the amplifier output;
      an access switch which is clocked at a sampling frequency to read said output; and
      a reset switch that is clocked at said sampling frequency to discharge said capacitor after said voltage is read.

19. The imaging array of claim 14, wherein said bandgap is at least 1.77 electron volts.

20. The imaging array of claim 14, wherein said bandgap is at least 1.98 electron volts.

21. The imaging array of claim 14, wherein said bandgap is at least 2.07 electron volts.

22. The imaging array of claim 14, wherein said bandgap is at least 2.25 electron volts.

23. The imaging array of claim 14, wherein said photodiode comprises:
   a detector layer comprising aluminum gallium arsenide; and
   a substrate layer comprising gallium arsenide.

24. The imaging array of claim 14, wherein said photodiode comprises:
   a detector layer comprising aluminum indium gallium arsenide, and
   a substrate layer comprising indium phosphide.

25. The imaging array of claim 14, wherein said photodiode comprises:
   a detector layer comprising gallium phosphide; and
   a substrate layer comprising indium phosphide.

26. The imaging array of claim 14, wherein said photodiode comprises:
   a detector layer comprising indium gallium nitride; and
   a substrate layer comprising sapphire.

27. The imaging array of claim 14, wherein the respective interface circuits of said cells have variable gain.

28. The imaging array of claim 27, wherein the gain of said respective interface circuits is variably set in a manner complementary to a non-uniformity in a response of respective photodiodes of said cells.

* * * * *